United States Patent [19]
Jennings

[11] Patent Number: 6,110,218
[45] Date of Patent: Aug. 29, 2000

[54] GENERATION OF MULTIPLE SIMULTANEOUS RANDOM TEST CYCLES FOR HARDWARE VERIFICATION OF MULTIPLE FUNCTIONS OF A DESIGN UNDER TEST

[75] Inventor: Roger H. Jennings, Austin, Tex.

[73] Assignee: Advanced Micro Devices, Inc., Sunnyvale, Calif.

[21] Appl. No.: 09/088,345

[22] Filed: Jun. 1, 1998

[51] Int. Cl.[7] ................................................ G06F 17/50
[52] U.S. Cl. .............................. 703/22; 703/14; 703/15; 703/16
[58] Field of Search ................................ 703/14, 15, 16, 703/22

[56] References Cited

U.S. PATENT DOCUMENTS 5,594,741  1/1997  Kinzelman et al. ..................... 714/741

OTHER PUBLICATIONS

Nachman et al.; "Random pattern testing for sequential circuits revisited"; IEEE—Proc. Symp. Fault Tolerant Computing; pp. 44–52, Jun. 1996.

Hortensius et al; "Parallel random number generation for VLSI systems using cellular automata"; IEEE—Trans. Computers; pp. 1466–1473, Oct. 1989.

*Primary Examiner*—Kevin J. Teska
*Assistant Examiner*—Hugh Jones
*Attorney, Agent, or Firm*—Akin, Gump, Strauss, Hauer & Feld, LLP

[57] ABSTRACT

Multiple test cycles may be randomly generated for simultaneous execution on a design under test using a simultaneous random cycles test generator. One form of the test generator is hardware description code run on a simulator. The test generator provides multiple random cycle description generators. A random cycle description generator randomly generates a particular test cycle at runtime using constraints provided by the test generator. A random cycle description generator granted access to a serial common cycle initiator may initiate random test cycles through the common cycle initiator. The common cycle initiator may execute the randomly determined test cycle or define and arm a cycle executor of a plurality of cycle executors to execute the randomly determined test cycle. While one random test cycle is executed, another random cycle description generator is selected to initiate another random test cycle on the common cycle initiator. The newly initiated test cycle is then executed while the initial test cycle is executing, accomplishing simultaneous execution of multiple test cycles. The delay following generation of one random test cycle before generation of another random test cycle is randomly determined. Attributes for a test cycle are also randomly determined. A simultaneous random cycles test generator provides verification of design-specific functions of a design under test which may be randomly and simultaneously changed.

27 Claims, 6 Drawing Sheets

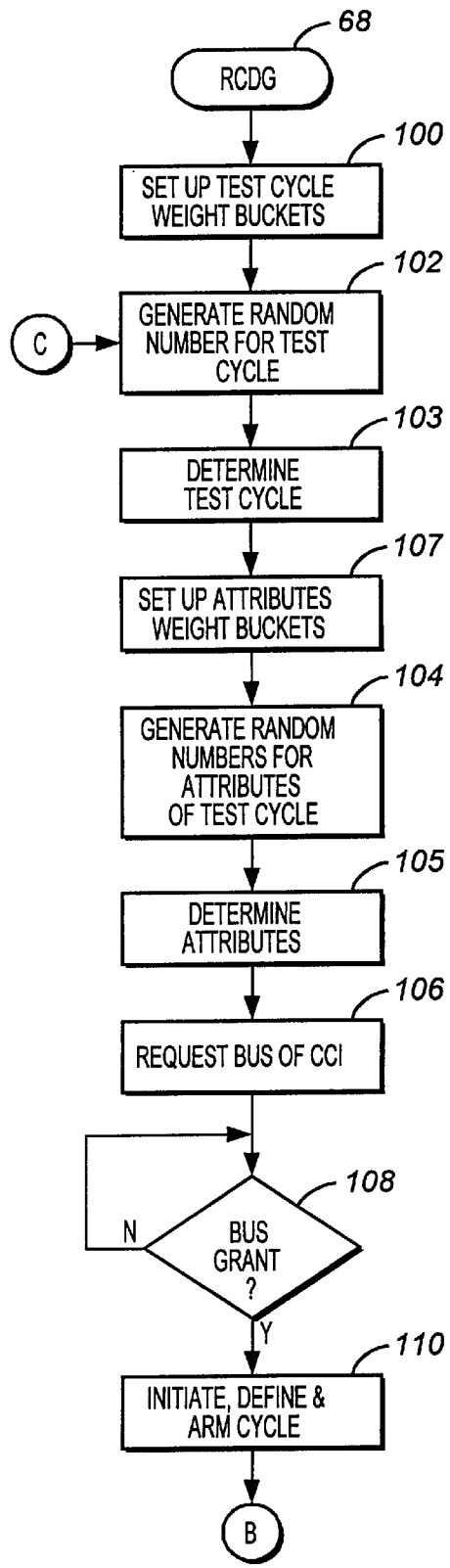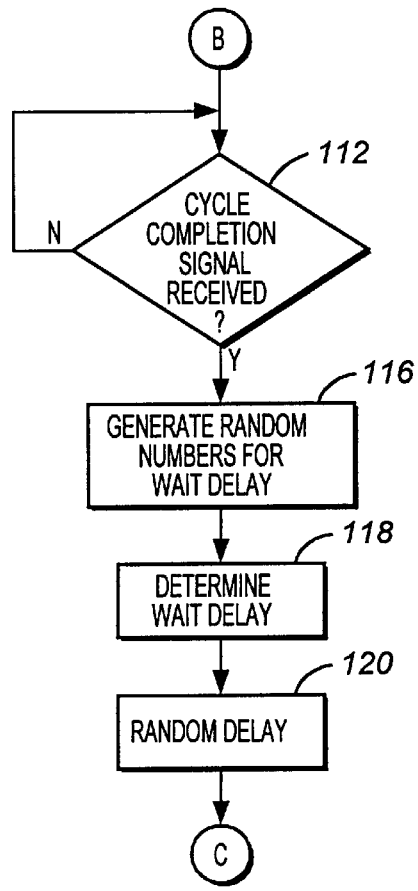
FIG. 6A
FIG. 6B

GENERATION OF MULTIPLE SIMULTANEOUS RANDOM TEST CYCLES FOR HARDWARE VERIFICATION OF MULTIPLE FUNCTIONS OF A DESIGN UNDER TEST

BACKGROUND OF THE INVENTION

1. Field of the Invention

The present invention relates to generating random test cycles for hardware verification, and more particularly to generating multiple simultaneous random test cycles for hardware verification of multiple functions of a design under test.

2. Description of the Related Art

In performing hardware verification for a chip design, the system environment in which the chip is to be placed is simulated with the goal of eliminating chip design problems before proceeding to fabrication of the chip. Since chip fabrication is both time consuming and expensive, much effort is directed to ensuring that a chip will run properly in the intended system environment. Simulation thus occupies an ever-increasing portion of the design cycle for a chip. Following fabrication of the silicon, a chip is installed onto a hardware platform and may be subjected to additional testing.

One conventional directed testing technique has been to use a random base cycle generator to simulate generation of random base cycles (events or activities) for a design under test. Random base cycles are the standard random cycles, such as memory and I/O cycles, executed on a design under test. The base random cycle generator produces random base cycles for a fixed set of tests (or modes) for a design under test through a cycle initiator. Interaction between blocks of a design under test significantly affects the functionality of a design under test. For a complex design under test, multiple test cycles may occur simultaneously and randomly within the system, resulting in certain scenarios of concern. So far as it is known, these scenarios of concern have been undetectable with conventional random base cycle generators.

The cycle initiator most commonly used with a base random cycle generator is a serial cycle initiator. A serial cycle initiator may only initiate one random cycle at a time. A conventional approach therefore has been to view and study the execution of a random cycle independent of the execution of other random cycles, despite the interdependencies of many random cycles.

SUMMARY OF THE INVENTION

Briefly, in accordance with the present invention, multiple test cycles may be randomly generated for simultaneous execution on a design under test using a simultaneous random cycles test generator. One form of the test generator is hardware description code run on a simulator. The test generator provides multiple random cycle description generators. A random cycle description generator randomly generates a particular test cycle at runtime using constraints provided by the test generator. A random cycle description generator granted access to a serial common cycle initiator may initiate random test cycles through the common cycle initiator. The common cycle initiator may execute the randomly determined test cycle or define and arm a cycle executor of a plurality of cycle executors to execute the randomly determined test cycle. While one random test cycle is executed, another random cycle description genera-tor is selected to initiate another random test cycle on the common cycle initiator. The newly initiated test cycle is then executed while the initial test cycle is executing, accomplishing simultaneous execution of multiple test cycles. The delay following generation of one random test cycle before generation of another random test cycle is randomly determined. Attributes for a test cycle are also randomly determined. A simultaneous random cycles test generator provides verification of design-specific functions of a design under test which may be randomly and simultaneously changed.

BRIEF DESCRIPTION OF THE DRAWINGS

The present invention may be more readily described and understood by reference to the accompanying drawings in which:

FIGS. 6A–6B are flowcharts of an exemplary process executed by a random cycle description generator in accordance with the present invention;

DETAILED DESCRIPTION OF PREFERRED EMBODIMENT

Figure 1A:
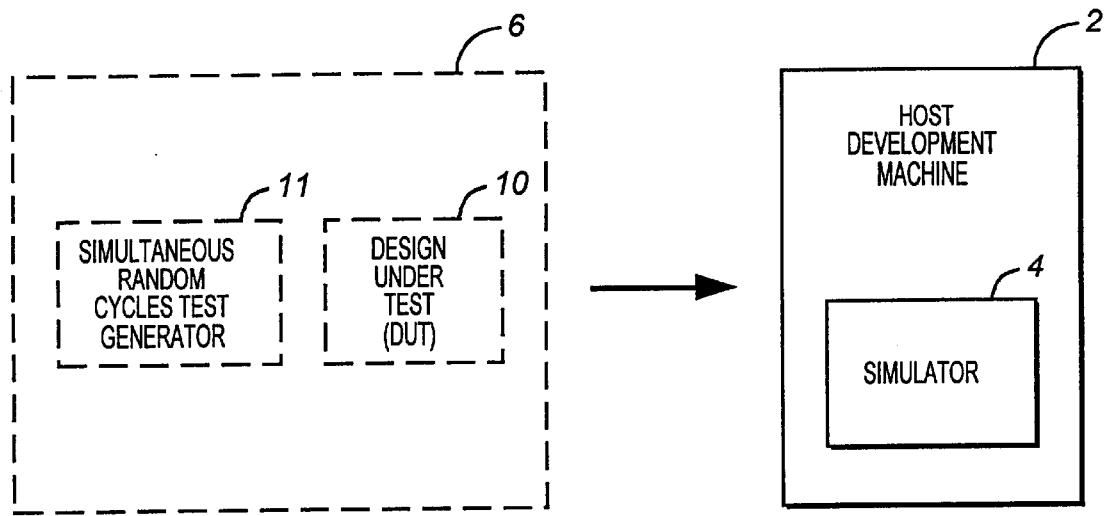
FIGS. 1A–1B are block diagrams of exemplary testing environments for running a simultaneous random cycles test generator in accordance with the present invention.
Figure 1B:
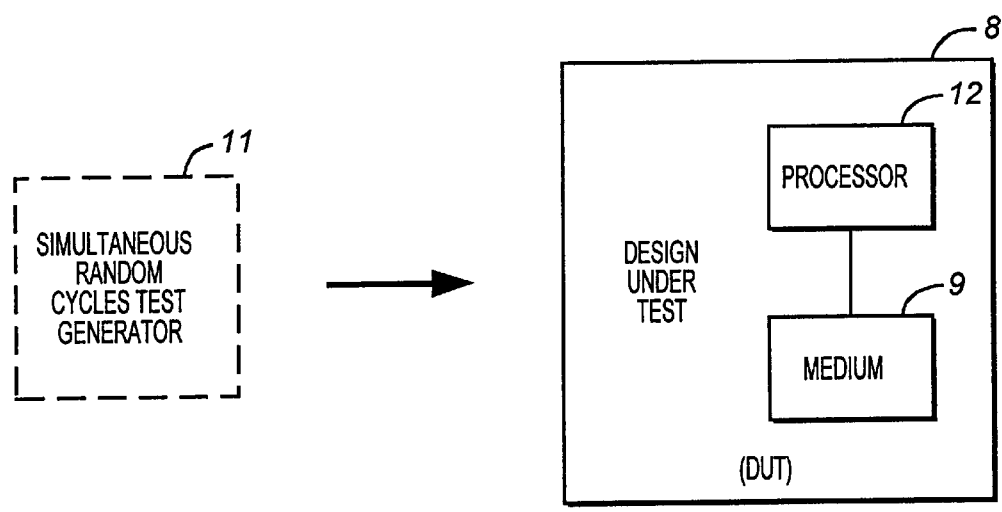

Referring to FIGS. 1A–1B, exemplary development environments for a simultaneous random cycles test generator of the present invention are shown. The software components are illustrated in phantom line, and the hardware components are illustrated in solid line. In one exemplary development environment, software code 6 is provided to a host development machine 2 such as a workstation for execution by a simulator 4. The software code 6 includes simultaneous random cycles test generator code 11 and design under test (DUT) code 10. The simultaneous random cycles test generator code 11 serves to generate multiple simultaneous test cycles for the design under test 8. The design under test code 10 serves to simulate the behavior of the actual design under test 8. The simultaneous random cycles test generator code 11 and design under test code 10 may be written in a hardware description language, such as Verilog, for example. This development environment permits multiple simultaneous test cycles to be executed for a design under test without the actual design under test.

An alternative development or testing environment includes providing the simultaneous random cycles test generator code 11 to the actual design under test 8. The design under test 8 includes a processor 12 for executing the simultaneous random cycles test generator code 11. The simultaneous random cycles test generator code 11 may be executed by the processor 12 from a processor readable medium 9, such as a memory, for storing the simultaneous random cycles test generator code 11. For this exemplary environment, the simultaneous random cycles test generator code 11 may be written in a machine language, such as assembly language. It should be understood that the described development environments are illustrative and not exhaustive. Further, it should be understood that other testing tools may be substituted in place of the simulator 4 (FIG. 1A).

Figure 2:
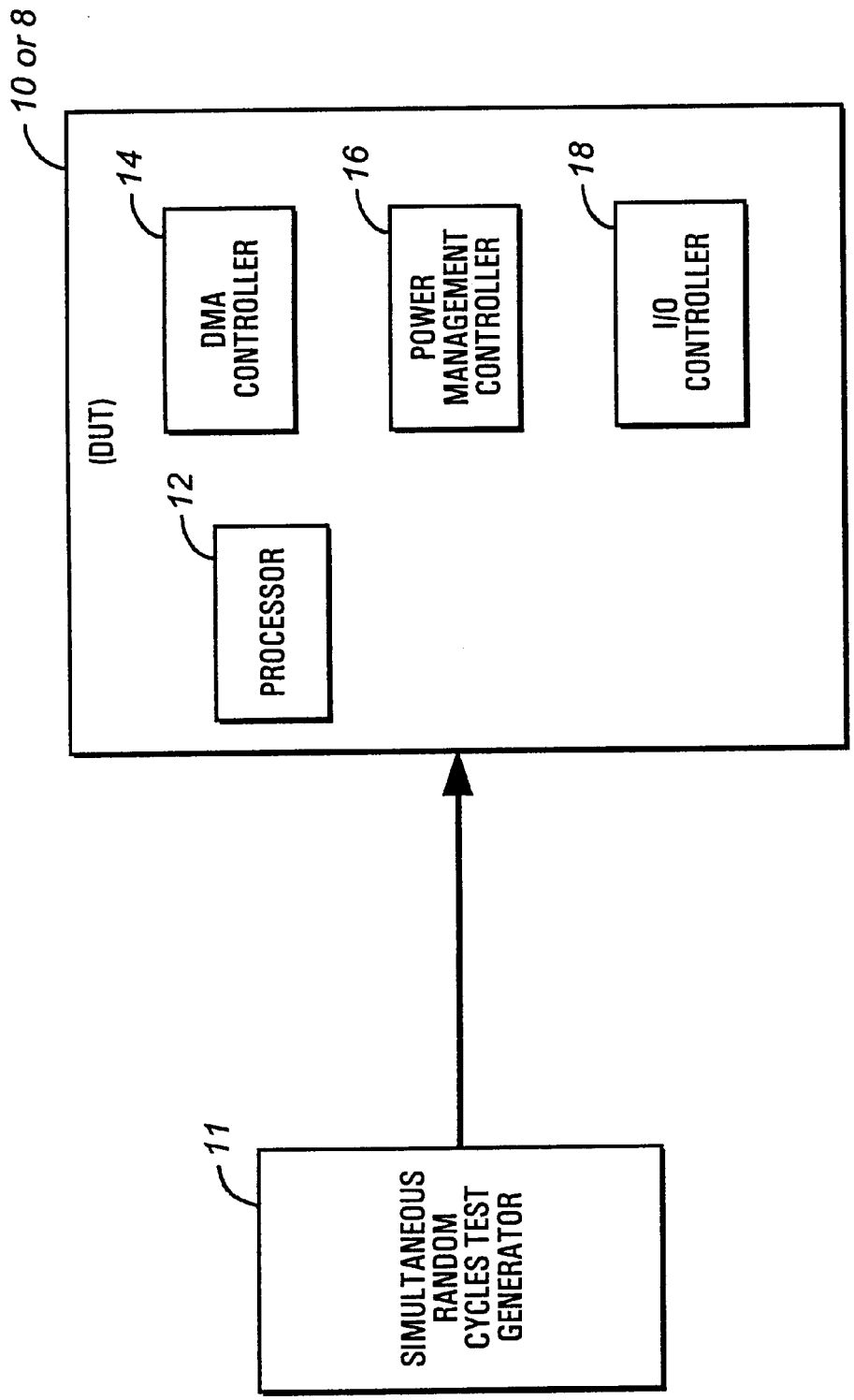
FIG. 2 is a schematic diagram of the design under test and the simultaneous random cycles test generator of FIGS. 1A–1B.

Referring to FIG. 2, an exemplary design under test 10 is shown in more detail. In the disclosed exemplary embodiment, the design under test 10 includes a processor 12, a DMA controller 14, a power management controller 16, and an I/O controller 18. It should be understood that the design under test 10 may include a variety of functional blocks. The simultaneous random cycles test generator 11 may test the functionality of any block of the design under test 8 and 10 by generating multiple test cycles, activities, and/or events to the design under test 8 and 10.

Figure 3:
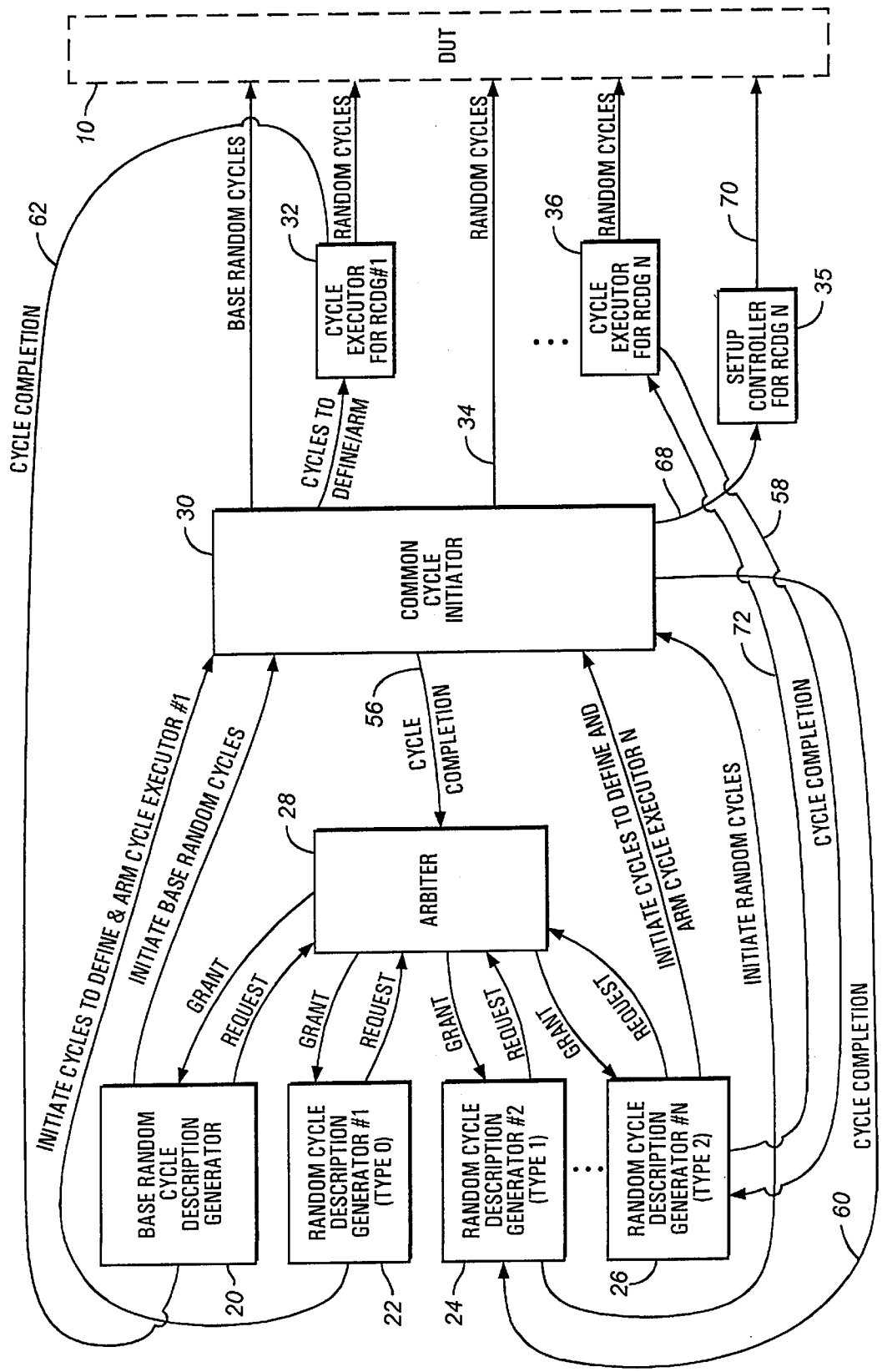
FIG. 3 is a schematic diagram of an exemplary random cycles test generation process in accordance with the random cycles test generator of FIG. 2.

Conventional random testing of a design under test has been limited to generation of base random cycles. Base random cycles driven to a design under test have typically been in the form of standard memory and I/O cycles. The random cycles test generator 11 of the present invention generates base random cycles and multiple random testing cycles for simultaneous execution on the design under test 10. Referring to FIG. 3, a schematic diagram of the objects modeled by exemplary random cycles test generator code 15 and interaction between the objects in accordance with the present invention is shown.

Common Cycle Initiator

A common cycle initiator 30 is an object representing a busmaster capable of serving as a serial common initiator for base random cycles and multiple random test cycles. When the common cycle initiator 30 is not processing random test cycles, the common cycle initiator 30 initiates base random cycles to the design under test 10. The design under test 10 is illustrated in a broken line to indicate that the design under test 10 is distinct from the random cycles test generator 11 which drives multiple random test cycles to the design under test 10. In the exemplary disclosed embodiment, base random cycles are initiated in either a full random mode or a write-read-verify mode. In the full random mode, reads and writes are directed in any order to memory and I/O devices of the design under test 10. In the write-read-verify mode, a write is directed to a memory or I/O device of the design under test 10 followed by a read to the particular device. Following the read command, the data which was the subject of the read command is verified. It should be understood that other modes for initiating base random cycles are possible. A base random cycle is initiated by the common cycle initiator 30 responsive to an initiation task call from a base random cycle description generator 20 if initiator request lines for a plurality of random cycle description generators 22, 24 and 26 are deasserted. An initiation task call passes parameters indicating the particular type of test cycle to execute. The plurality of random cycle description generators 22, 24 and 26 modeled by the random cycles test generator 11 are described below.

The common cycle initiator 30 may also receive an initiation task call to initiate a cycle to define and arm a cycle executor 32. The initiation task call is driven to the common cycle initiator 30 after the random cycle description generator 22 or 26 is granted access to the common cycle initiator 30. In response to the initiation signal, the common cycle initiator 30 initiates a cycle to define and arm the cycle executor 32 for the random test cycle generated by the random cycle description generator owning the bus of the common cycle initiator 30. Access to the common cycle initiator 30 is controlled by an arbiter 28. The arbiter 28 may receive an initiator request signal from the base random cycle description generator 20 or an initiator request signal from one of the random cycle description generators 22, 24, or 26. The arbiter 28 uses a predetermined priority scheme in granting access to the common cycle initiator 30 to a particular one of the random cycle description generators 22, 24, or 26. The processor 12 may serve as the common cycle initiator 30. As illustrated in FIG. 1, the common cycle initiator 30 may be integrated into the same chip as the design under test 10. It should be understood that busmasters other than a processor may serve as the common cycle initiator 30. When initiation of a base random cycle or initiation of a cycle to define and arm the cycle executor 32 is complete, the common cycle initiator 30 provides a cycle completion signal 56 to the arbiter 28. The arbiter 28 then processes the next pending initiator request.

Random Cycle Description Generator

A random cycle description generator in accordance with the present invention is an object representing a source of random test cycles to be driven to a functional block of the design under test 10. The random cycles test generator 11 may define a plurality of the random cycle description generators 22, 24 and 26. Each random cycle description generator 22, 24, or 26 supports a plurality of random test cycles. The random cycle description generators 22, 24, and 26 are preferably defined for each functional block of the design of test 10 of verification interest. By modeling a plurality of random cycle description generators 22, 24, and 26, the random cycles test generator 11 provides design-specific verification of the design under test 10. In the disclosed embodiment, the random cycles test generator 11 is written in Verilog. It should be understood that the random cycles test generator 11 may be written in a variety of languages, such as a hardware description language, assembly language, hardware verification language, or other language. It could even be implemented schematically.

The random cycles test generator 11 may define at least three types of random cycle description generators: Type 0, Type 1, and Type 2. The random cycle description generator types differ in terms of the process for executing a randomly generated test cycle. For the Type 0 random cycle description generator 22, the common cycle initiator 30 runs a cycle to define and arm a cycle executor 32. The armed cycle executor 32 executes the generated test cycle. For the Type 1 random cycle description generator 24, the common cycle initiator 30 itself executes the generated test cycle. For the Type 2 random cycle description generator 26, the common cycle initiator 30 sends a control signal 68 to a setup controller 35. In response to the bus cycle 68, the setup controller 35 sets up the block of the design under test 10 to receive the generated test cycle with a control signal 70. The setup controller 35 may be part of the design under test 10. Also, the random cycle description generator 26 sends a control signal 72 to a cycle executor 36 to define and arm the cycle executor 36. If the block of the design under test 10 is ready to receive the generated test cycle, the cycle executor 36 executes the generated test cycle or set of generated test cycles.

Within the random cycles test generator code 11, a task may be defined for each particular random cycle description generator 20, 22, 24, and 26. In an exemplary disclosed embodiment, tasks are defined for a PCMIA (Personal Computer Memory Card International Association) DMA (Direct Memory Access) test cycle, a power management unit (PMU) mode change, and a CPU clock speed change. A task RCG_DMA_PCMIA_CYCLE_GN corresponds to a DMA PCMIA cycle; a task RCG_PMU_MODE_CHANGE corresponds to a PMU mode change; and a task RCG_CPU CLOCK_SPEED_CHANGE corresponds to a CPU clock speed mode change. It should be understood that the above tasks are exemplary as a task may be defined for any configuration or mode of a design under test 10. Each task defined for a random cycle description generator 20, 22, 24, and 26 is coded with the protocol for the common cycle initiator 30.

In accordance with the present invention, the random cycles test generator code 15 performs three types of random operations. One type of random operation is a determination of which test cycle supported by a random cycle description generator 20, 22, 24, and 26 is to be generated. The second type of random operation is the determination of the delay following generation of a test cycle by a random cycle description generator 20, 22, 24, and 26 before the random cycle description generator 20, 22, 24, and 26 generates a next test cycle. The third type of random operation is a determination of the particular attributes of a test cycle to be generated. For example, for a DMA test cycle, attributes such as transfer type, transfer width, transfer size, breakup frequency, and breakup delay may be randomly determined.

Further, in the disclosed embodiment, weight "buckets" corresponding to the weight given to each supported random test cycle are defined in a test case file. The use of weight "buckets" is discussed below. A test case file may also be used to constrain the configurations of test cycles defined for a random cycle description generator 20, 22, 24, and 26 by defining "windows." A "window" is a set of numbers representing a valid configuration for a test cycle of a random cycle description generator 20, 22, 24, and 26. The test case file may further be used to define the weights for the windows and the attributes for each window. In accordance with the present invention, test cycles are determined or picked randomly at runtime (i.e. "on the fly") based on the cycle constraints defined by the random cycles test generator 11.

Cycle Executor

The random cycles test generator code 15 may provide a plurality of the cycle executors 32 and 36 which run in parallel. The cycle executor 32 or 36 may correspond to a particular random cycle description generator 20, 22, 24, and 26 or a set of random cycle description generator 20, 22, 24, and 26. The cycle executor 32 or 36 receives a signal to define and arm itself for a particular random test cycle from the common cycle initiator 30 if the random test cycle is generated by the Type 0 random cycle description generator 22 or the Type 2 random cycle description generator 26. In response to the define and arm signal, the cycle executor 32 or 36 executes the corresponding random test cycle.

In the disclosed embodiment, the cycle executor 32 or 36 is modeled in Verilog by defining a cycle executor module. The cycle executor module may include declarations of ports representing input signals and output signals for the cycle executor 32 or 36, declarations of data objects representing registers, wires, and/or memories for the cycle executor 32 or 36, and statements for modeling the circuitry of the cycle executor 32 or 36. Execution of a random test cycle by the cycle executor 32 or 36 may be a function of a variety of randomly determined attributes. Examples of randomly determined attributes which may affect execution of a random test cycle by a cycle executor 32 or 36 include weight delay, the number of random test cycles, data delay, the number of breakup cycles, breakup frequency, and breakup delay.

Figure 4:
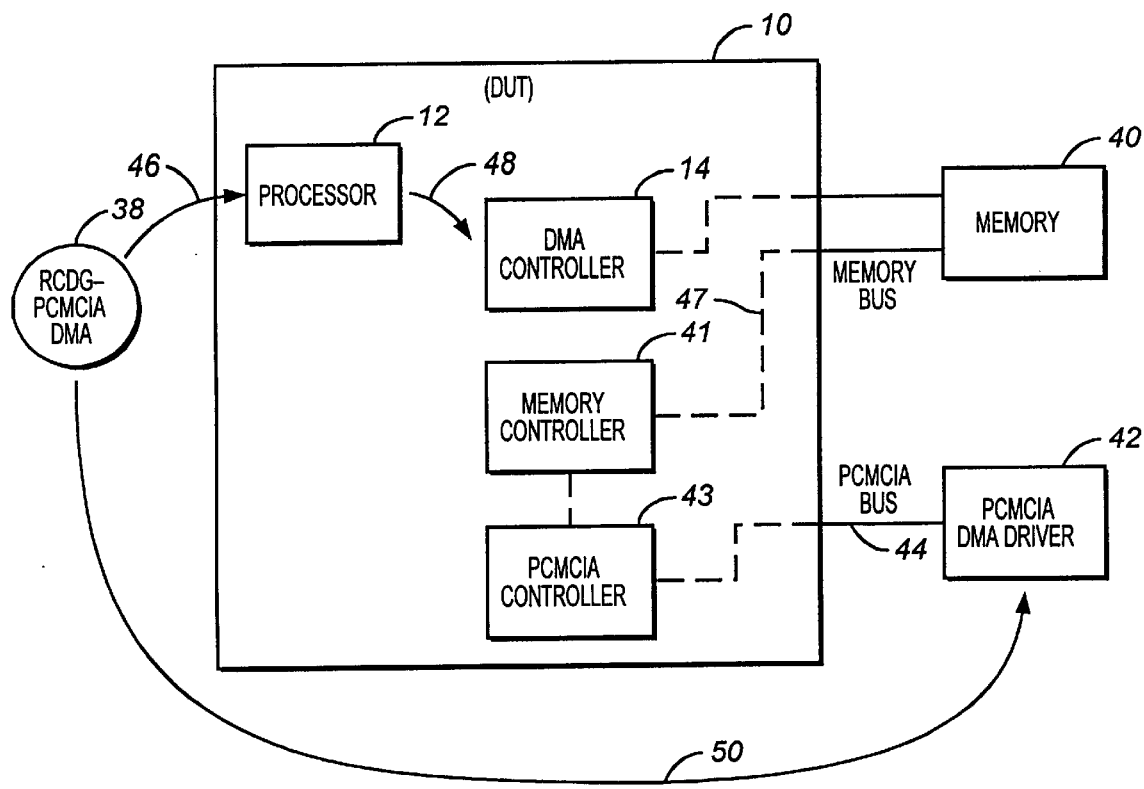
FIG. 4 is a schematic diagram of an exemplary random cycles test generation process in accordance with a PCMCIA DMA random cycle description generator of the random cycles test generator of FIG. 2.

Referring to FIG. 4, a schematic illustration of an exemplary random cycles test generation process for a PCMCIA DMA random cycle description generator in accordance with the present invention is shown. A random cycle description generator 38 is defined for generating random PCMCIA DMA test cycles. The PCMCIA DMA test cycles randomly generated are provided to the processor 12 by a task call 46. For this example, the processor 12 corresponds to the common cycle initiator 30 of FIG. 3. In response to the task call 46 from the PCMCIA DMA random cycle description generator 38, the processor 12 provides a bus cycle 48 to configure a DMA controller 14. When the PCMCIA DMA random cycle description generator 38 detects that it owns the bus of the processor 12, the PCMCIA DMA random cycle description generator 38 provides a task call 50 to call a PCMCIA DMA driver 42. In response to the call by the PCMCIA DMA random cycle description generator 38, the PCMCIA DMA driver 42 either provides data to or fetches data from a PCMCIA controller 43 across a PCMCIA DMA bus 44. The PCMCIA controller 43 is coupled to a memory controller 41. Data is transferred between the PCMCIA controller 43 and the memory controller 41, the direction of data transfer depending on the type of DMA test cycle. The memory controller 41 provides or receives data from a memory 40 across a memory bus 47. The memory 40 is one exemplary block of the design under test 10. For this example, the DMA controller 14 corresponds to the setup controller 35 of FIG. 3, and the PCMCIA DMA driver 42 corresponds to the cycle executor 36 of FIG. 2. It should be understood that objects other than a cycle executor and a setup controller may be defined to facilitate initiation of a random test cycle.

Figure 5:
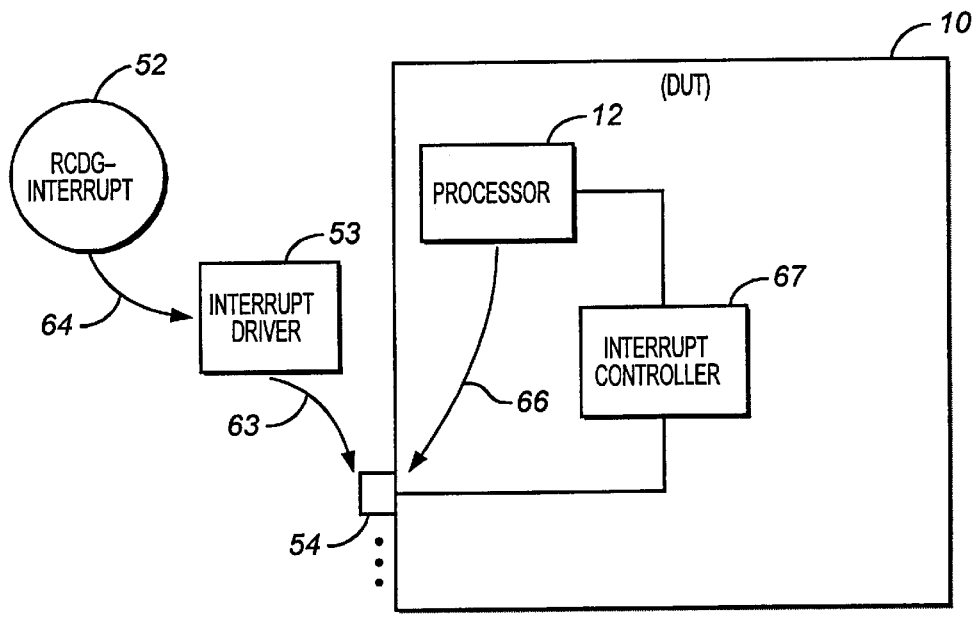
FIG. 5 is a schematic diagram of an exemplary random cycles test generation process in accordance with an interrupt random cycle description generator of the random cycles test generator of FIG. 2.

Referring to FIG. 5, a schematic diagram for illustrating an exemplary random cycle generation process for an interrupt cycle description generator in accordance with the present invention is shown. An interrupt cycle description generator 52 is used to randomly generate interrupt cycles for the design under test 10. When the interrupt cycle description generator 52 is granted ownership of the processor 12, the interrupt cycle description generator 52 provides a control signal 64 to an interrupt driver 53 which drives an interrupt to a pin of a set of pins 54 of the design under test 10. An interrupt controller 67 detects the interrupt, resolves the interrupt priority, and communicates the interrupt event to the processor 12. The processor 12 initiates an interrupt cycle for the detected interrupt by providing a control signal 66 to the particular pin 54. The interrupt cycle description generator 52 is of Type 1 as the processor 12 itself initiates the interrupt cycle.

Referring to FIGS. 6A–6B, a flowchart of exemplary steps performed by random cycle description generator code 68 is shown. Because this code can be written in Verilog, the flowchart of FIGS. 6A–6B represents a hardware implementation; but also because it can be written in Verilog, a flowchart is deemed the simplest way to understand that hardware implementation. It should be understood that each random cycle description generator corresponding to the random cycle description generator code 68 runs in parallel with other random cycle description generators. Beginning in step 100, the weight bucket for each particular test cycle supported by the random cycle description generator 22, 24, or 26 is defined. A weight bucket is generated for each test cycle by defining a front edge of the weight bucket, weight_range_low, and a back edge of the weight bucket, weight_range_high. Any value corresponding to edges of a weight bucket and values between the edges of a weight bucket represent the range of the weight bucket. If a value within a weight bucket range is selected, the test cycle corresponding to the particular weight bucket is selected. From step 100, control proceeds to step 102, where a random number is generated representing a particular test cycle. In the disclosed embodiment, the Verilog statement for generating a random number representing a test cycle is

SEED_FACTOR=({$RANDOM(SEED))}99%).

SEED_FACTOR is a deterministic variable representing a random number. It should be understood that statements other than the Verilog statement above may be defined to achieve a like result. Control next proceeds to step 103 where the test cycle to be generated is determined using the random number generated in step 102. An example of a Verilog task call used in the disclosed embodiment for determining a test cycle for a power management unit (PMU) speed mode random cycle description generator is

RCG_PMU_GET_SPEED_MODE (SEED_FACTOR, MODE).

The task RCG_PMU_GET_SPEED_MODE, which uses an input argument SEED_FACTOR and an output argument MODE, tests to determine which test cycle weight bucket supported by the PMU Speed Mode random description generator corresponds to the generated random number SEED_FACTOR. The task performs such a test by comparing SEED_FACTOR to the weight bucket ranges of each weight bucket supported by the PMU Speed Mode random description generator. The matching weight bucket is stored in the output argument MODE. A test cycle has attributes which may be randomly changed.

From step 103, control proceeds to step 107. In step 103, weight buckets for the attributes of the determined test cycle are generated. In the disclosed embodiment, the weight buckets are generated by executing a call to a task for setting weight buckets for the attributes of the determined test cycle. A weight bucket is generated for each attribute by defining a front edge of the weight bucket, weight_range_low, and a back edge of the weight bucket, weight_range_high. Values corresponding to edges of a weight bucket and values between the edges of a weight bucket represent the range of the weight bucket. If a value within a weight bucket range is selected, the attribute corresponding to the particular weight bucket is selected.

Control proceeds from step 107 to step 104. In step 104, random numbers are generated for the attributes of the determined test cycle. The Verilog statement for generating a random number in step 102 may also be used for generating random numbers in step 104. Next, in step 105, attributes of the determined test cycle are determined based on which attribute weight buckets the random numbers generated in step 104 correspond to. For example, the following Verilog statement may be used in the disclosed embodiment for determining a transfer type for a DMA PCMCIA test cycle:

RCG_DMA_GET_XFER_TYPE (SEED_FACTOR, XFER_TYPE).

The task RCG_DMA_GET_XFER_TYPE tests to determine which transfer type weight bucket corresponds to the generated random number, SEED_FACTOR. The task performs such a test by comparing SEED_FACTOR to the weight bucket ranges of each weight bucket supported by the DMA transfer random description generator. The matching weight bucket is stored in the argument XFER_TYPE.

It should be understood that statements other than the Verilog statements above may be used to achieve results similar to the above Verilog statements. From step 105, control proceeds to step 106 where the random cycle description generator 22, 24 of 26 requests the bus of the common cycle initiator 30. In step 108, it is determined whether the bus of the common cycle initiator 30 has been granted to the requesting random cycle description generator 22, 24 or 26. If the bus of the common cycle initiator 30 has not been granted to the random cycle description generator 22, 24 or 26, control loops at step 108 such that the random cycle description generator waits for access to the bus. If the random cycle description generator 22, 24, or 26 obtains ownership of the bus of the common cycle initiator 30, control proceeds from step 108 to step 110. In step 110, a define and arm cycle is initiated. For the random cycle description generator 22 or 26 of Type 0 or Type 2, the define and arm cycle is initiated for the cycle executor 32 or 36. For the random cycle description generator 24 of Type 1, the define and arm cycle is initiated for the common cycle initiator 30. A define and arm cycle prepares an object, such as the cycle executor 32 or 36, for executing a random test cycle.

From step 110, control proceeds to step 112 where it is determined if a cycle completion signal has been received. If a cycle completion signal has not been received, control remains at step 112. If a cycle completion signal has been received, control proceeds to step 116 where a random number is generated to represent a wait delay. The wait delay represents the period of time following generation of a test cycle before a next test cycle is generated. The Verilog statements used for generating a random number in step 102 and step 104 may also be used for generating a random number in step 116. From step 116, control proceeds to step 118 where the wait delay for the random cycle description generator 22, 24, or 26 is determined. Control then proceeds to step 120 where the random wait delay is executed. Following the expiration of the random wait delay period, control proceeds from step 120 back to step 102 to begin generation and processing of the next test cycle.

Figures 7, 8:
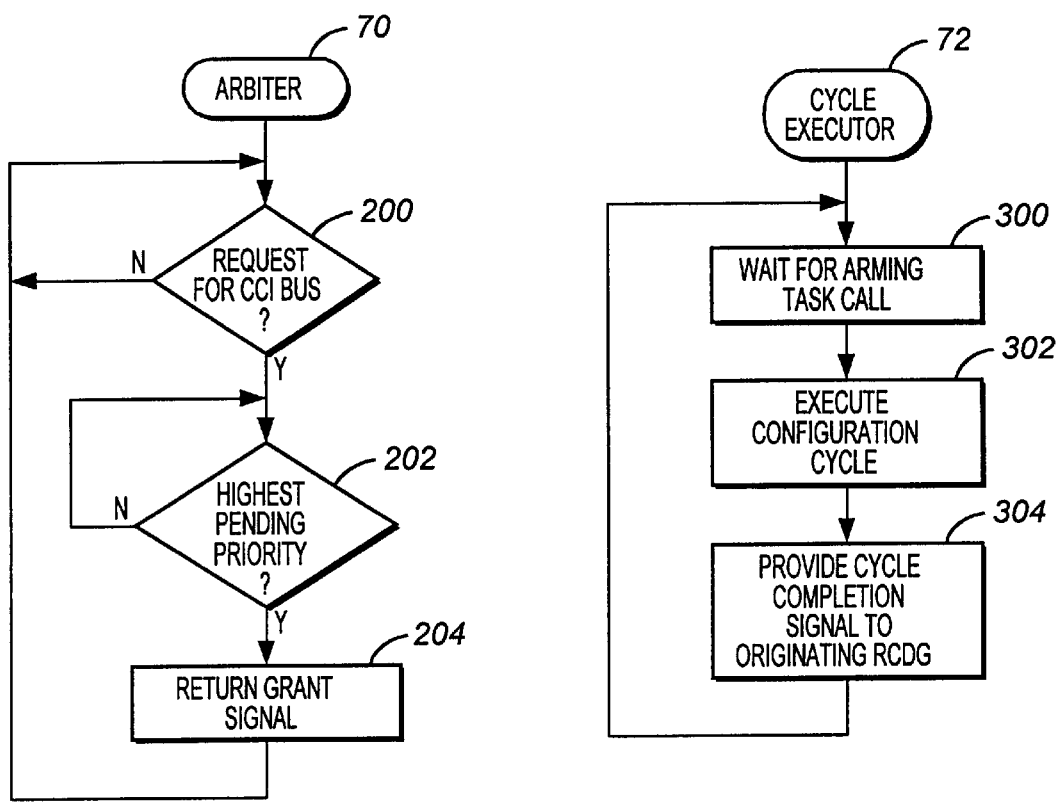
FIG. 7 is a flowchart of an exemplary process executed by an arbiter in accordance with the present invention.
FIG. 8 is a flowchart of an exemplary process executed by a cycle executor in accordance with the present invention.

Referring to FIG. 7, the exemplary steps performed by an arbiter module 70 corresponding to the arbiter 28 (FIG. 3) is shown. In step 200, the arbiter detects if there is a request for the base of the serial common cycle initiator 30 by a random cycle description generator 22, 24, and 26 or a base random description generator 20. Next, in step 202, it is determined if the requesting random cycle description generator has the highest pending priority level. If the requesting random cycle description generator has the highest priority level, then control proceeds to step 202 where the arbiter returns a grant signal to the requesting random cycle description generator, giving the requesting random cycle description generator control of the bus of the common cycle initiator 30. The signal thus provides access to the common cycle initiator 30 based on a predetermined priority scheme. From step 204, control returns to step 200 where the arbiter waits for a new request signal. If the requesting random cycle description generator does not have the highest priority level, control loops at step 202. A requesting random cycle description generator that does not immediately have the highest priority level thus must wait for earlier requesting random cycle description generators with higher priority to release ownership of the common cycle initiator bus. In accordance with the present invention, the base random cycle description generator 20 has the lowest priority level.

Referring to FIG. 8, a flowchart of the steps performed by a cycle executor module 72 of the random cycles test generator code 15 in accordance with the present invention is shown. Beginning with step 300, it is determined whether the cycle executor 32 or 36 detects a cycle arming the cycle executor 32 or 36 for cycle execution. For the random cycle description generator 22 of Type 0, the common cycle initiator 30 provides an arming task call. For the random cycle description generator 26 of Type 2, the random cycle description generator 26 provides the arming task call. If a task call to arm a cycle executor is not detected in step 300, control loops at step 300. If the task call is detected, control proceeds to step 302 where the cycle executor executes the corresponding random test cycle. From step 302, control proceeds to step 304 where the cycle executor provides a cycle completion signal to the originating random cycle description generator 22 or 26. From step 304, control returns to step 300.

Thus, the use of multiple random cycle description generators initiated serially through a serial common cycle initiator and executing in parallel, such as through a plurality of cycle executors, provides for random and simultaneous generation of multiple test cycles for a design under test. Multiple random test cycles thus are interleaved with one another and will be executed simultaneously. For example, the effect of a DMA transfer occurring while an interrupt is occurring may be studied. Further, by defining random cycle description generators for design-specific functions of verification interest, test cases focused on simultaneous execution of multiple random design-specific cycles may be addressed.

The foregoing disclosure and description of the invention are illustrative and explanatory thereof, and various changes in the number of variables, number of parameters, order of steps, field sizes, data types, code elements, code size, connections, components, and materials, as well as in the details of the illustrated hardware and software and construction and method of operation may be made without departing from the spirit of the invention. Also, it should be understood that certain functionality of the present invention implemented as a task call may be alternatively be implemented as a cycle, set of signals, or the like. Likewise, certain functionality of the present invention implemented as a cycle may alternatively be implemented as a task call, set of signals, or the like.

We claim:

1. A host development machine for generating multiple simultaneous random test cycles for a design under test, comprising:
   a simulator for running code to simulate the design under test and simultaneous random cycles test generator code for providing a simultaneous random cycles test generator;
   the design under test code modeling behavior of the design under test; and
   the simultaneous random cycles test generator code, comprising:
      random cycle description generator code for modeling a base random cycle description generator and a plurality of random cycle description generators for generating simultaneous multiple random test cycles; and
      arbitrated common cycle initiator code for modeling a serial common cycle initiator for initiating the multiple random test cycles and for arbitrating access to the serial common cycle initiator by the plurality of random cycle description generators and a base random cycle description generator.

2. The host development machine of claim 1, the simultaneous random cycles test generator code further comprising:
   cycle executor code for modeling a plurality of cycle executors for executing the multiple random test cycles in parallel responsive to cycles to arm the plurality of cycle executors.

3. The host development machine of claim 1, wherein the arbitrated common cycle initiator code initiates the multiple random test cycles through execution of the random test cycles by the common cycle initiator.

4. The host development machine of claim 1, wherein the arbitrated common cycle initiator code initiates the multiple random test cycles by arming a plurality of cycle executors for executing the multiple random test cycles.

5. The host development machine of claim 1, wherein each random cycle description generator of the plurality of random cycle description generators corresponds to a different functional block of the design under test.

6. The host development machine of claim 1, wherein each random cycle description generator of the plurality of random cycle description generators supports a plurality of random test cycles associated with a functional block of the design under test.

7. The host development machine of claim 6, wherein each random test cycle of the plurality of random test cycles is weighted to define the frequency of selection of each random test cycle.

8. The host development machine of claim 1, wherein a random cycle description generator of the plurality of random cycle description generators randomly generates a test cycle supported by the random cycle description generator.

9. The host development machine of claim 1, wherein the arbitrated common cycle initiator code executes base random cycles generated by the base random cycle description generator when the initiator request lines for the plurality of random cycle description generators are deasserted.

10. The host development machine of claim 1, wherein the random cycle description generator code and arbitrated common cycle initiator code are written in a hardware description language.

11. The host development machine of claim 1, wherein the random cycle description generator code and the arbitrated common cycle initiator code are written in a hardware verification language.

12. A design under test adapted for verification of multiple simultaneous random test cycles, comprising:
   a design under test, comprising:
      a processor;
      a medium readable by the processor, storing:
         random cycle description generator code for modeling a base random cycle description generator and a plurality of random cycle description generators for generating multiple random test cycles; and
         arbitrated common cycle initiator code for modeling a serial common cycle initiator for initiating random test cycles and for arbitrating access to the common cycle initiator by the plurality of random code description generators and a base random cycle description generator.

13. The design under test of claim 12, the medium readable by the processor further storing:
   cycle executor code for modeling a plurality of cycle executors for executing the multiple random test cycles in parallel responsive to cycles to arm the plurality of cycle executors.

14. The design under test of claim 12, wherein the arbitrated common cycle initiator code initiates the multiple random test cycles through execution of the random test cycles by the common cycle initiator.

15. The design under test of claim 12, wherein the arbitrated common cycle initiator code initiates the multiple random test cycles by arming a plurality of cycle executors for executing the multiple random test cycles.

16. The design under test of claim 12, wherein each random cycle description generator of the plurality of random cycle description generators corresponds to a different functional block of the design under test.

17. The design under test of claim 12, wherein each random cycle description generator of the plurality of random cycle description generators supports a plurality of random test cycles associated with a functional block of the design under test.

18. The design under test of claim 12, wherein each random test cycle of the plurality of random test cycles is weighted to define the frequency of selection of each random test cycle.

19. The design under test of claim 12, wherein a random cycle description generator of the plurality of random cycle description generators randomly generates a test cycle supported by the random cycle description generator.

20. The design under test of claim 12, wherein the arbitrated common cycle initiator code executes base random cycles generated by the base random cycle description generator when the initiator request lines for the plurality of random cycle description generators are deasserted.

21. The design under test of claim 12, wherein the simultaneous random cycles test generator code is written in machine language.

22. A method of generating multiple simultaneous random test cycles for a design under test, comprising the steps of:

defining a plurality of random cycle description generators each supporting a plurality of random test cycles;

arbitrating access to a serial common cycle initiator by the plurality of random cycle description generators;

randomly generating a test cycle by a random cycle description generator of the plurality of random cycle description generators; and initiating the generated test cycle by the serial common cycle initiator.

23. The method of claim 22, further comprising the step of:

defining a plurality of cycle executors for executing initiated test cycles in parallel.

24. The method of claim 22, the step of defining a plurality of random cycle description generators comprising the step of:

defining a plurality of random cycle description generators for functional blocks of the design under test.

25. The method of claim 22, further comprising the step of:

executing the initiated test cycle on the design under test.

26. The method of claim 22, further comprising the step of:

defining a weight bucket for each supported test cycle of a random cycle description generator of the plurality of random cycle description generators to define a frequency of selection of each supported test cycle.

27. The method of claim 22, further comprising the step of:

randomly determining attributes for the test cycle.

* * * * *